United States Patent

Blume

[15] 3,663,886

[45] May 16, 1972

[54] PARAMETRIC AMPLIFIERS WITH IDLER CIRCUIT FEEDBACK

[72] Inventor: Hans-Juergen C. Blume, Hampton, Va.

[73] Assignee: The United States of America as represented by the Administrator of the National Aeronautics and Space Administration

[22] Filed: Dec. 17, 1970

[21] Appl. No.: 99,175

[52] U.S. Cl. ....................330/4.5, 307/88.3

[51] Int. Cl. ....................H03f 7/04

[58] Field of Search ....................330/4.5; 307/88.3

*Primary Examiner*—Roy Lake
*Assistant Examiner*—Darwin R. Hostetter
*Attorney*—Howard J. Osborn, William H. King and John R. Manning

[57] ABSTRACT

Two parametric amplifiers connected such that there is feedback from the idler circuit of one of the amplifiers to the idler circuit of the other amplifier to effect noise reduction.

6 Claims, 3 Drawing Figures

INVENTOR.
HANS-JUERGEN C. BLUME

BY Howard J. Osborn
William H. King
ATTORNEYS

INVENTOR.
HANS-JUERGEN C. BLUME
BY Howard J. Osborn
William H. King
ATTORNEYS

INVENTOR.
HANS-JUERGEN C. BLUME

BY Howard J. Osborn
William H. King
ATTORNEYS

PARAMETRIC AMPLIFIERS WITH IDLER CIRCUIT FEEDBACK

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

The invention relates generally to parametric amplifiers and more specifically concerns noise reduction in parametric amplifiers.

In the past, better cooling techniques, better varactor diodes, optimum pumping and suitable modes of operation have been used for the purpose of improving parametric amplifier performance to secure low noise radio receiving systems. The primary purpose of this invention is to provide idler feedback to reduce internally generated noise in parametric amplifiers thereby further lowering the noise in radio receiving stations employing parametric amplifiers.

SUMMARY OF THE INVENTION

The invention consists essentially of first and second parametric amplifiers with each including a pump input, a signal input and an idler input. The pump inputs of both parametric amplifiers are supplied by a single generator and the idler input of the first parametric amplifier is supplied from the signal produced at the idler input of the second parametric amplifier.

In the first embodiment of the invention, an input signal is applied through a first circulator to the input of the first parametric amplifier. The purpose of the first circulator is to separate the incident power wave from the power wave reflected from the first parametric amplifier. A second circulator in front of the second parametric amplifier serves as a stabilizing device to keep the gain constant. With the aid of a directional coupler a fraction of the reflected or amplified signal from the first parametric amplifier is delivered to the second parametric amplifier which feeds it back to the first parametric amplifier via the idler circuit feedback line. The directional coupler is followed by a mixer and mixer oscillator which converts the signal down to an intermediate frequency.

In a second embodiment of the invention the directional coupler is eliminated, the output of first circulator is applied to the input of the second circulator and the output of the second circulator is connected to the mixer. In this embodiment the two parametric amplifiers are cascaded and both act as reflection-type negative resistance amplifiers, with reciprocal idler feedback.

DETAILED DESCRIPTION OF THE INVENTION

Figure 1:
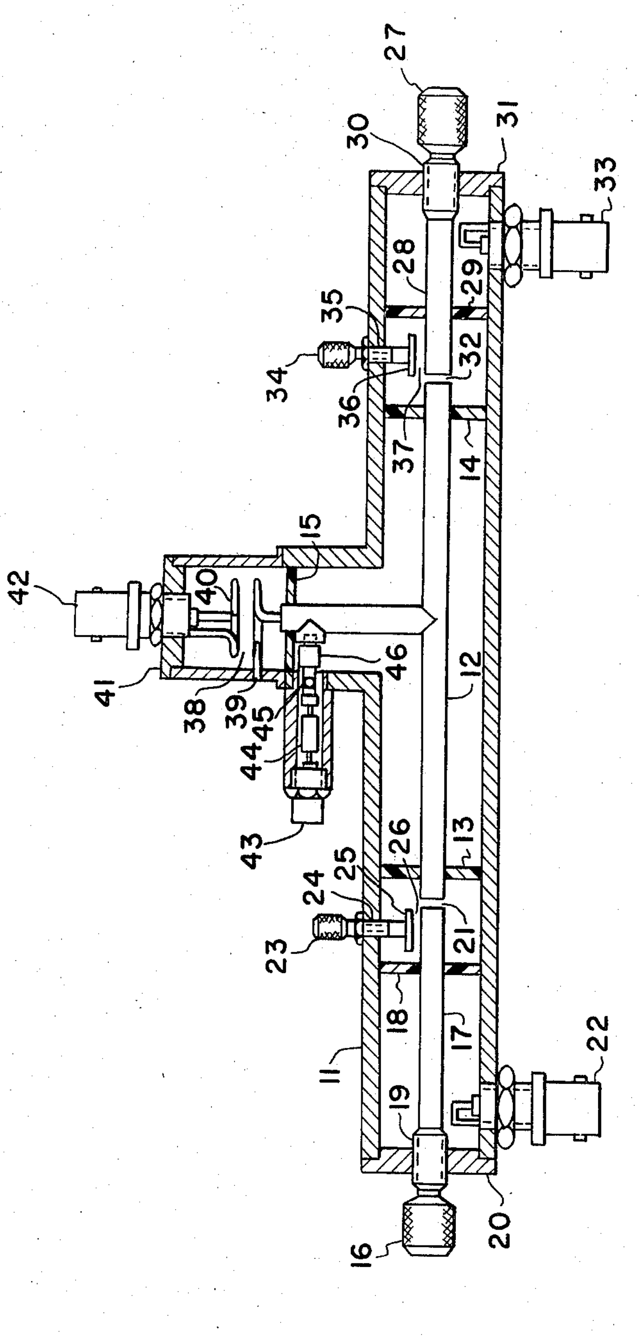
FIG. 1 is a cross-sectional view of a parametric amplifier suitable for use in this invention.

Turning now to the embodiments of the invention selected for illustration in the drawings, the parametric amplifier disclosed in FIG. 1 is an amplifier suitable for use in this invention. The amplifier is embodied in a T-shape tubular housing 11. Inside housing 11 is a T-shaped coaxial line 12 which is held in place by teflon spacers 13, 14, and 15. At one end of housing 11 is an idler circuit tuner that is attached to a coaxial line 17 held in place by a teflon spacer 18. Located between tuning knob 16 and coaxial line 17 is a threaded member 19 adapted to thread through a washer-shaped member 20 to change the space 21 between coaxial lines 12 and 17. Near the end and passing through housing 11 is an idler input terminal 22. A tuning knob 23 is attached through a threaded member 24 to a plate 25. Threaded member 24 is adapted to thread through housing 11 to change the space 26 between plate 25 and coaxial line 17. The end of housing 11, input terminal 22, coaxial line 17, the coupling capacitance (space 21) and the tuning capacitance (space 26) constitute the idler circuit of this parametric amplifier.

The pump circuit of the parametric amplifier, which is identical structurally to the idler circuit, is at the right end of housing 11. The numerals 27–37 in the pump circuit designate parts that are identical to parts 16–26, respectively, in the idler circuit.

The signal input circuit includes a transformer 38 whose secondary winding 39 is connected to coaxial line 12 and whose primary winding 40 is connected through a washer-shaped member 41 to the signal input terminal 42. The amplifier provides means for applying a bias input to the signal input circuit. This means includes a bias input terminal 43, a choke 44, a feedthrough capacitor 45 and a varactor 46 which is connected to coaxial line 12. It should be noted that it is not necessary that the specific parametric disclosed be used in the present invention. It is only necessary that the parametric amplifier used have a terminal to the idler circuit. However, the specific parametric amplifier disclosed works well in practicing this invention.

Figure 2:
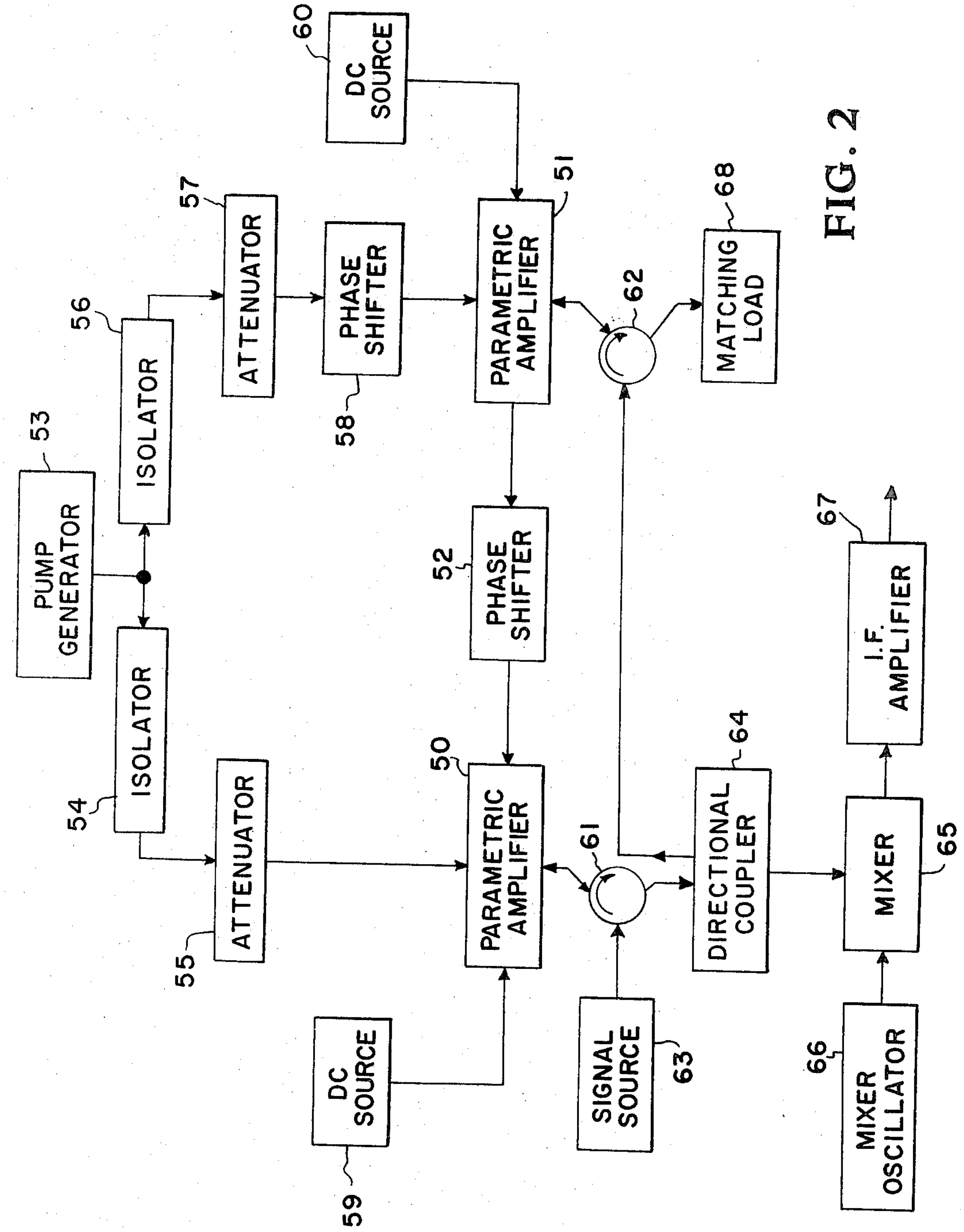
FIG. 2 is a block diagram of one embodiment of this invention.

In the embodiment of the invention shown in FIG. 2, first and second parametric amplifiers 50 and 51, like the one disclosed in FIG. 1, have their idler circuits connected together. The signal at the idler circuit terminal of amplifier 51 is applied through a phase shifter 52 to the idler circuit terminal of amplifier 50. An 1,800 MHz pump generator 53 supplies the pump frequencies for both of the parametric amplifiers 50 and 51. Pump generator 53 is connected through an isolator 54 and an attenuator 55 to the pump circuit terminal of parametric amplifier 50, and is connected through an isolator 56, an attenuator 57 and a phase shifter 58 to the pump circuit terminal of parametric amplifier 51. The purpose of isolators 54 and 56 is to make the two feed lines of the pump power independent of reaction effects. The attenuator 55 and 57 are used so that the gain of each amplifier can be regulated. D.C. sources 59 and 60 provide the bias voltage inputs to the two amplifiers. The input signal terminal of amplifier 50 is connected to an output of a first circulator 61 and the input signal terminal of amplifier 51 is connected to an output of a second circulator 62. A 400 MHz signal source 63 is applied to the input of circulator 61. The other output of circulator 61 is applied through a directional coupler 64 to a mixer 65 where the signal is mixed with signal from a mixer oscillator 66 to form an I.F. signal which is amplified by an amplifier 67. Part of the signal from circulator 61 is directed by directional coupler 64 to the input of circulator 62. The other output of circulator 62 is connected to a matching load 68.

In the operation of the embodiment of the invention shown in FIG. 2, the signal input circuit is tuned to 400 MHz, the pump circuit is tuned to 1,800 MHz and the idler circuit is tuned to 1,400 MHz in each of the amplifiers 50 and 51. The 400 MHz signal from signal source 63 is applied through circulator 61 to the signal input terminal of amplifier 50. The purpose of circulator 61 is to separate the incident power wave from the reflected power wave. Hence, the reflected power wave from amplifier 50 is applied to directional coupler 64. With the aid of directional coupler 64 a fraction, preferably −3 db, of the reflected wave or amplified signal from amplifier 50 is delivered through circulator 62 to amplifier 51. Circulator 62 along with matching load 68 serves as a stabilizing device to keep the gain constant. The amplified signal applied to amplifier 51 has in it the internally generated noise of amplifier 50. Hence, the idler circuit of amplifier 51 has this noise in it. Consequently, when the idler circuit signal, from amplifier 51 is shifted in phase by phase shifter 52 and applied to the idler circuit of amplifier 50 the internally generated noise in amplifier 50 tends to be cancelled out. Tests have indicated that the embodiment of the invention in FIG. 2 has a noise improvement of 1.35 db over one of the parametric amplifiers alone.

Figure 3:
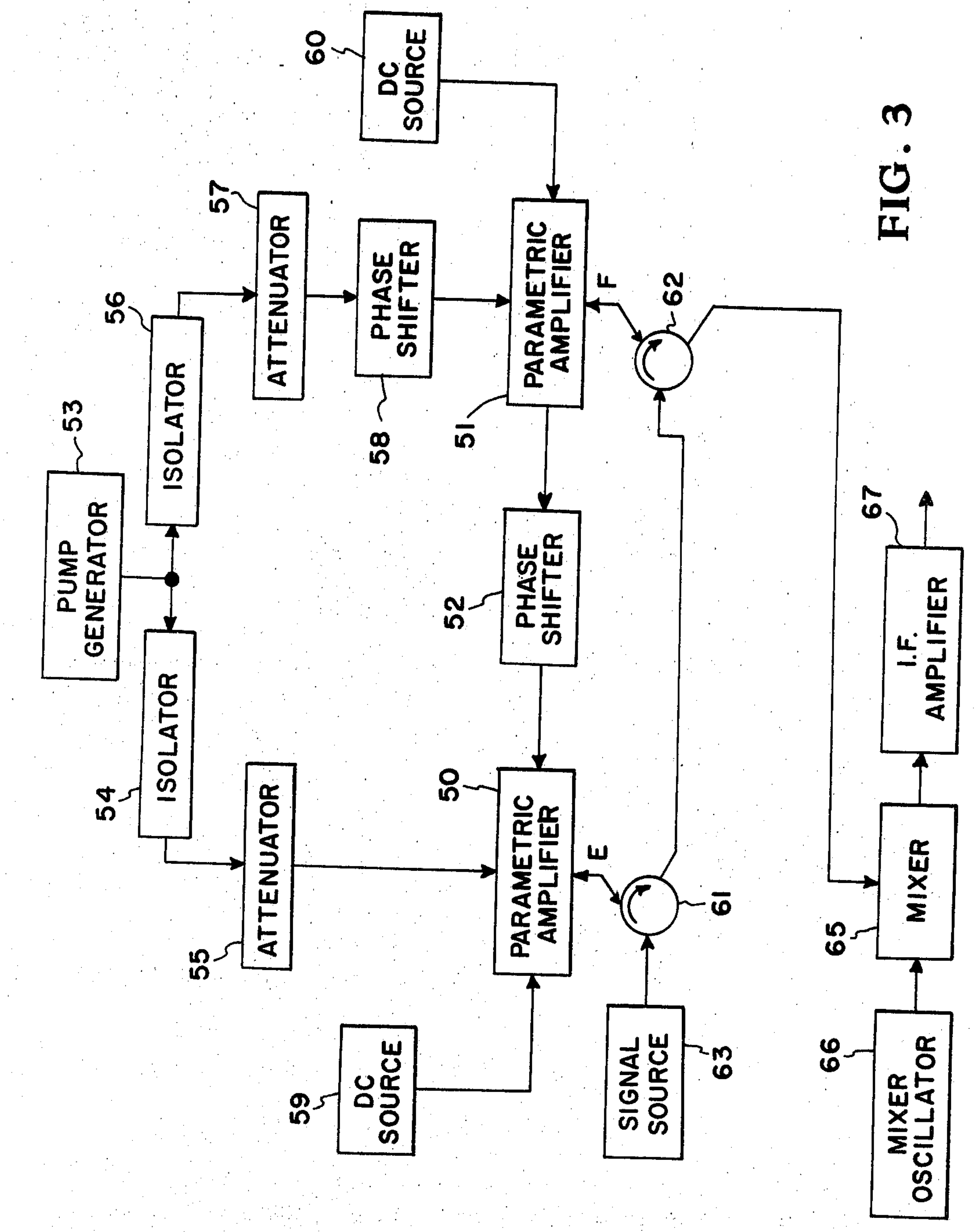
FIG. 3 is a block diagram of a second embodiment of this invention.

The embodiment of the invention in FIG. 3 is exactly like the one in FIG. 2 except the directional coupler and matching load are eliminated and the outputs of circulators 61 and 62 are connected to the input of circulator 62 and mixer 65, respectively. Hence, in this embodiment the two amplifiers are cascaded and both act as reflection-type negative resistance amplifiers with reciprocal idler feedback. Noise measurements for this embodiment shows an improvement of 1.85 db over one amplifier alone. However, the tuning of the two amplifiers and the adjustment of the phase shifter in the idler feedback circuit in this embodiment is critical in comparison to the embodiment in FIG. 2 and has to be done carefully in order to prevent onset to oscillation.

The advantage of this invention is that it provides simple inexpensive means for reducing noise in parametric amplifiers.

It is to be understood that the forms of the invention herewith shown and described are to be taken as preferred embodiments. Other embodiments are possible without departing from the spirit and scope of the invention claimed in the following claims.

What is claimed as new and desired to be secured by Letters Patent of the United States is:

1. Apparatus for reducing the internally generated noise of a first parametric amplifier having input, pump and idler circuits with terminals for its signal input and pump circuits comprising:

means for providing a terminal to the idler circuit of said first parametric amplifier;

a second parametric amplifier like said first parametric amplifier including said terminal to the idler circuit;

phase shifting means connected between the idler circuit terminals of said first and second parametric amplifiers;

means for providing power to the terminals of the pump circuits of said first and second parametric amplifiers;

means for applying an input signal to the signal input circuit terminal of said first parametric amplifier; and means for applying at least a part of the amplified signal from said first parametric amplifier to the signal input circuit terminal of said second parametric amplifier whereby the resulting signal generated in the idler circuit of said second parametric amplifier is fed back to the idler circuit of said first parametric amplifier to reduce the noise internally generated in said first parametric amplifier.

2. Apparatus according to claim 1 wherein said means for applying an input signal to the signal input circuit terminal includes a signal source applied through a first circulator to the signal input circuit terminal of said first parametric amplifier whereby the amplfied signal from the first parametric amplifier appears at the output of said first circulator.

3. Apparatus according to claim 2 wherein said means for applying at least a part of the amplified signal from said first parametric amplifier to the signal input circuit terminal of said second parametric amplifier includes a directional coupler which diverts a part of the amplified signal to the second parametric amplifier.

4. Apparatus according to claim 3 wherein said diverted parts of said amplified signal is applied through a second circulator to the input terminal of said second parametric amplifier.

5. Apparatus according to claim 4 wherein a matching load is connected to the output of said second circulator.

6. Apparatus according to claim 2 wherein said means for applying at least a part of the amplified signal from said first parametric amplifier to the signal input circuit terminal of said second parametric amplifier includes a second circulator whose input is connected to receive at least a part of the amplified signal from the output of said first circulator.

* * * * *